United States Patent
Huang et al.

(10) Patent No.: US 9,509,260 B2
(45) Date of Patent: *Nov. 29, 2016

(54) HIGH-SPEED TRANSIMPEDANCE AMPLIFIER

(71) Applicant: TAIWAN SEMICONDUCTOR MANUFACTURING COMPANY, LTD., Hsinchu (TW)

(72) Inventors: Tsung-Ching Huang, San Jose, CA (US); Chan-Hong Chern, Palo Alto, CA (US); Tao Wen Chung, San Jose, CA (US); Ming-Chieh Huang, San Jose, CA (US); Chih-Chang Lin, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 125 days.

This patent is subject to a terminal disclaimer.

(21) Appl. No.: 14/503,898

(22) Filed: Oct. 1, 2014

(65) Prior Publication Data

US 2015/0014518 A1    Jan. 15, 2015

Related U.S. Application Data

(63) Continuation of application No. 13/527,365, filed on Jun. 19, 2012, now Pat. No. 8,872,592.

(51) Int. Cl.
*H03F 3/08*    (2006.01)
*H03F 3/30*    (2006.01)
*H03F 3/45*    (2006.01)
*H03F 1/02*    (2006.01)

(52) U.S. Cl.
CPC ............ *H03F 3/082* (2013.01); *H03F 1/0205* (2013.01); *H03F 3/08* (2013.01); *H03F 3/3022* (2013.01); *H03F 3/45179* (2013.01); *H03F 3/45183* (2013.01); *H03F 2200/216* (2013.01); *H03F 2203/30031* (2013.01); *H03F 2203/45222* (2013.01); *H03F 2203/45644* (2013.01); *H03F 2203/45686* (2013.01); *H03F 2203/45702* (2013.01); *H03F 2203/45724* (2013.01)

(58) Field of Classification Search
CPC .. H03F 3/082; H03F 3/45179; H03F 1/0205; H03F 3/45183; H03F 3/08; H03F 3/3022; H03F 2203/45222; H03F 2200/216; H03F 2203/45702

See application file for complete search history.

(56) References Cited

U.S. PATENT DOCUMENTS

| | | | |
|---|---|---|---|
| 6,737,924 B1 | 5/2004 | Paillet et al. | |
| 6,937,071 B1 | 8/2005 | Moraveji | |
| 7,276,969 B1 | 10/2007 | Aram | |
| 8,405,461 B2 | 3/2013 | Moto et al. | |

*Primary Examiner* — Tony Ko
(74) *Attorney, Agent, or Firm* — Hauptman Ham, LLP

(57) ABSTRACT

A transimpedance amplifier includes a first inverter having a first input node and a first output node. The first input node is configured to receive an input signal. A second inverter has a second input node and a second output node. The second input node connects to a reference voltage terminal. The first inverter and the second inverter are configured to provide a differential output voltage signal between the first output node and the second output node. A first amplifier is configured to provide feedback to the first input node and a second amplifier is configured to provide feedback to the second input node.

20 Claims, 5 Drawing Sheets

HIGH-SPEED TRANSIMPEDANCE AMPLIFIER

PRIORITY CLAIM

The present application is a continuation of U.S. application Ser. No. 13/527,365, filed Jun. 19, 2012, which is incorporated by reference herein in its entirety.

TECHNICAL FIELD

The present disclosure relates generally to an integrated circuit and more particularly to a transimpedance amplifier (TIA).

BACKGROUND

In some applications, an optical link is more energy-efficient than an electrical link for high-speed (e.g., 40 Gbps or higher) input/output traffic. A transimpedance amplifier (TIA) receives a small current signal from a photo detector in an optical receiver and converts it into a voltage signal for the next stage circuit in the optical receiver. A low-power and high-sensitivity TIA is desirable for high-speed optical links. For the TIA, reduction of jitter and generation of a clean eye pattern in the received signal are issues for applications in high-data rates.

BRIEF DESCRIPTION OF THE DRAWINGS

Reference is now made to the following descriptions taken in conjunction with the accompanying drawings, in which.

DETAILED DESCRIPTION

Figure 1:
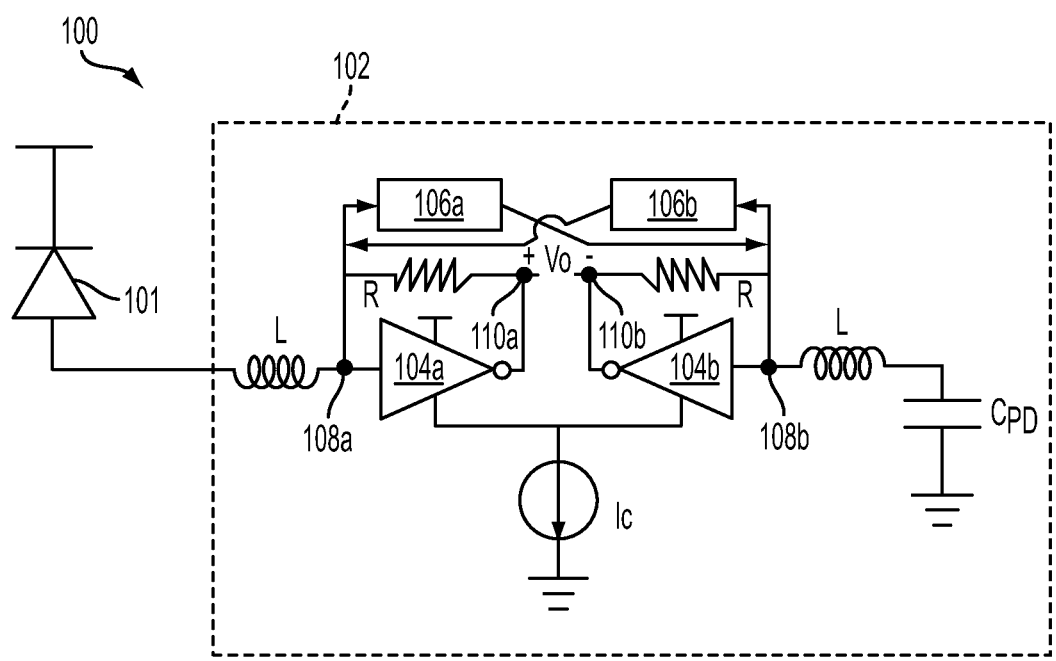
FIG. 1 is a schematic diagram of an exemplary transimpedance amplifier (TIA) in an optical receiver according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary transimpedance amplifier (TIA) 102 in an optical receiver 100 according to some embodiments. A portion of an optical receiver 100 in FIG. 1 includes a photo detector 101 and a TIA 102. The TIA 102 includes two inverters 104a and 104b, two amplifiers 106a and 106b, two resistors R, two inductors L, a capacitor $C_{PD}$, and a current source Ic. The inverters 104a and 104b have input nodes 108a and 108b and output nodes 110a and 110b, respectively.

The input node 108a of the inverter 104a is coupled to an input current from the photo detector 101 through one inductor L. The input node 108b of the inverter 104b is coupled to a reference voltage terminal (e.g., ground terminal) through another inductor L and the capacitor $C_{PD}$. The two optional inductors L are coupled to the input nodes 108a and 108b for inductive peaking (i.e., for increased bandwidth). The inductance values of both inductors L are the same to have a balanced circuit for a differential output voltage signal Vo in some embodiments. The differential output Vo is provided between the output nodes 110a and 110b of the inverters 104a and 104b.

Amplifiers 106a and 106b provide feedback and inverting amplification to the inverter input nodes 108b and 108a respectively to have a balanced circuit for the differential output Vo. The amplifier 106b receives its input from the inverter input node 108b and provides its output to the input node 108a of the inverter 104a, while the amplifier 106a receives its input from the inverter input node 108a and provides its output to the input node 108b of the inverter 104b.

For example, if the signal at the input node 108a of the inverter 104a increases, the signal at the amplifier 106a also increases and provides decreasing output at the input node 108b of the inverter 104b. Thus, the output node 110b of the inverter 104b increases. With the input node 108b of the inverter 104b decreasing, the amplifier 106b has its input decreasing and provides its output increasing to the input node 108a. Thus, the signal at the output node 110a of the inverter 104a decreases.

One resistor R is coupled between the input node 108a and the output node 110a of the inverter 104a (i.e., in parallel) and another resistor R is coupled between the input node 108b and the output node 110b of the inverter 104b (i.e., in parallel). The resistors R keep the voltages at the input nodes 108a and 108b at a high gain region of the inverters 104a and 104b by providing feedback from the output nodes 110a and 110b. The resistance values of both resistors R are the same to have a balanced circuit for the differential output Vo. The current source Ic is coupled to both the inverters 104a and 104b for regulating electrical current, which improves noise immunity and balance of the differential output voltage Vo by having a common current source Ic. The capacitor $C_{PD}$ coupled between the input node 108b and the reference voltage terminal (e.g., ground terminal) has an equivalent capacitance of the photo detector 101 to have a balanced circuit in some embodiments.

By having the current source Ic (current tail) and amplifiers 106a and 106b, the noise immunity and jitter performance is significantly improved by the TIA 102 in the optical receiver 100. Also, the power consumption is reduced compared to a similar circuit using two current sources instead of one current source Ic.

Figure 2:
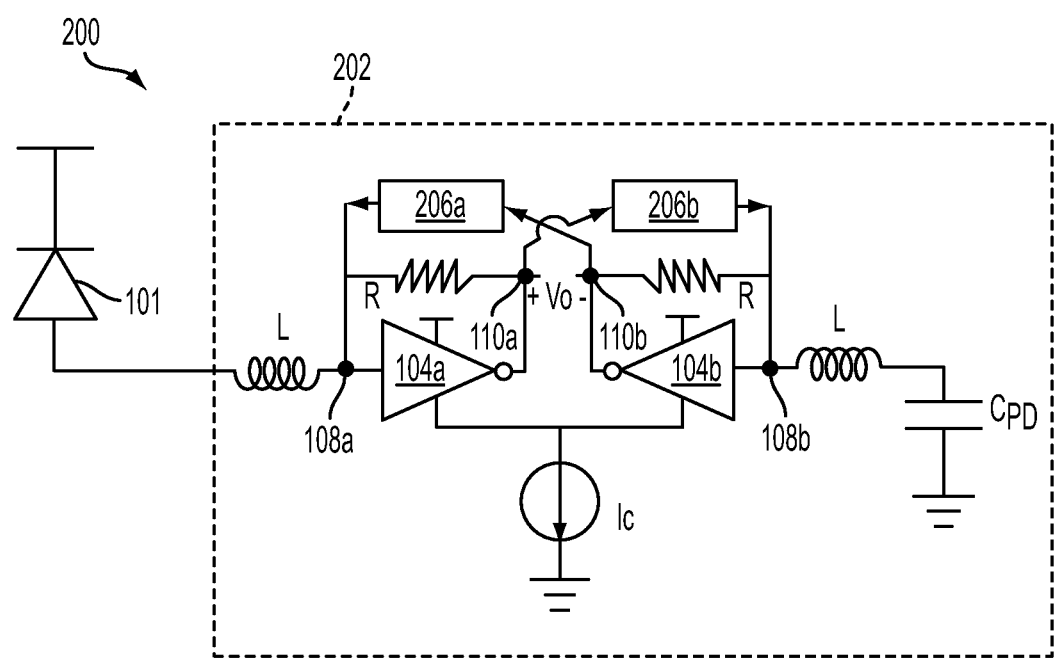
FIG. 2 is a schematic diagram of another exemplary TIA in an optical receiver according to some embodiments.

FIG. 2 is a schematic diagram of another exemplary TIA 202 in an optical receiver 200 according to some embodiments. The TIA 202 is similar to the TIA 102 in FIG. 1, except that the amplifiers 206a and 206b provide feedback and non-inverting amplification to the inverter input nodes 108a and 108b respectively to have a balanced circuit for the differential output Vo. The amplifier 206a receives its input from the inverter output node 110b and provides its output to the input node 108a of the inverter 104a, while the amplifier 206b receives its input from the inverter output node 110a and provides its output to the input node 108b of the inverter 104b.

For example, if the signal at the input node 108a increases, the signal at the output node 110a of the inverter 104a decreases that is input to the amplifier 206b. The amplifier 206b provides its output decreasing to the input node 108b of the inverter 104b. Thus, the signal at the output node 110b increases. With the output node 110b of the inverter 104b increasing, the amplifier 206a has its input increasing and provides its output increasing to the input node 108a of the inverter 104a. Thus, the output node 110a of the inverter 104a decreases.

Similar to the TIA 102, the noise immunity and jitter performance is significantly improved by the TIA 202 in the optical receiver 200. Also, the power consumption is reduced compared to a similar circuit using two current sources instead of one current source Ic.

Figure 3:
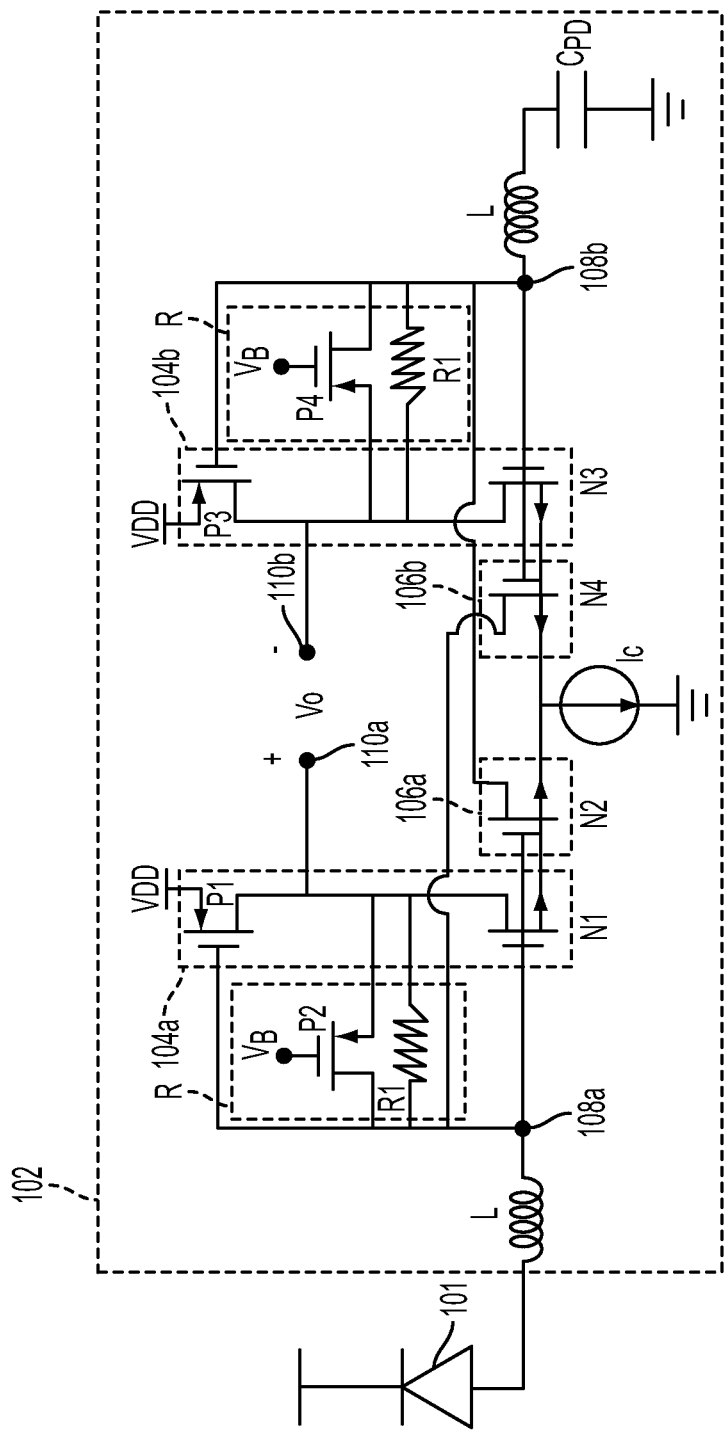
FIG. 3 is an exemplary circuit diagram of the TIA in FIG. 1 according to some embodiments.

FIG. 3 is an exemplary circuit diagram of the TIA in FIG. 1 according to some embodiments. The inverter 104a comprises a PMOS transistor P1 and an NMOS transistor N1. The inverter 104b comprises a PMOS transistor P3 and an NMOS transistor N3. The amplifier 106a comprises an NMOS transistor N2 and the amplifier 106b comprises an NMOS transistor N4. A PMOS transistor P2 is coupled in parallel with a resistor R1 and a PMOS transistor P4 is coupled in parallel with another resistor R1. By adjusting the bias voltage $V_B$ of the PMOS transistor P2 or P4, the effective combined resistance R of the resistor R1 and the PMOS transistor P2 or P4 can be changed.

In one example, the TIA 102 in FIG. 3 provided the output voltage Vo with a clean eye pattern and a small jitter of less than 1 ps for a high speed input signal at 40 Gbps, compared to a conventional TIA having a jitter of about 10 ps. The frequency and speed of the TIA 102 is not limited to this example in other embodiments.

Figure 4:
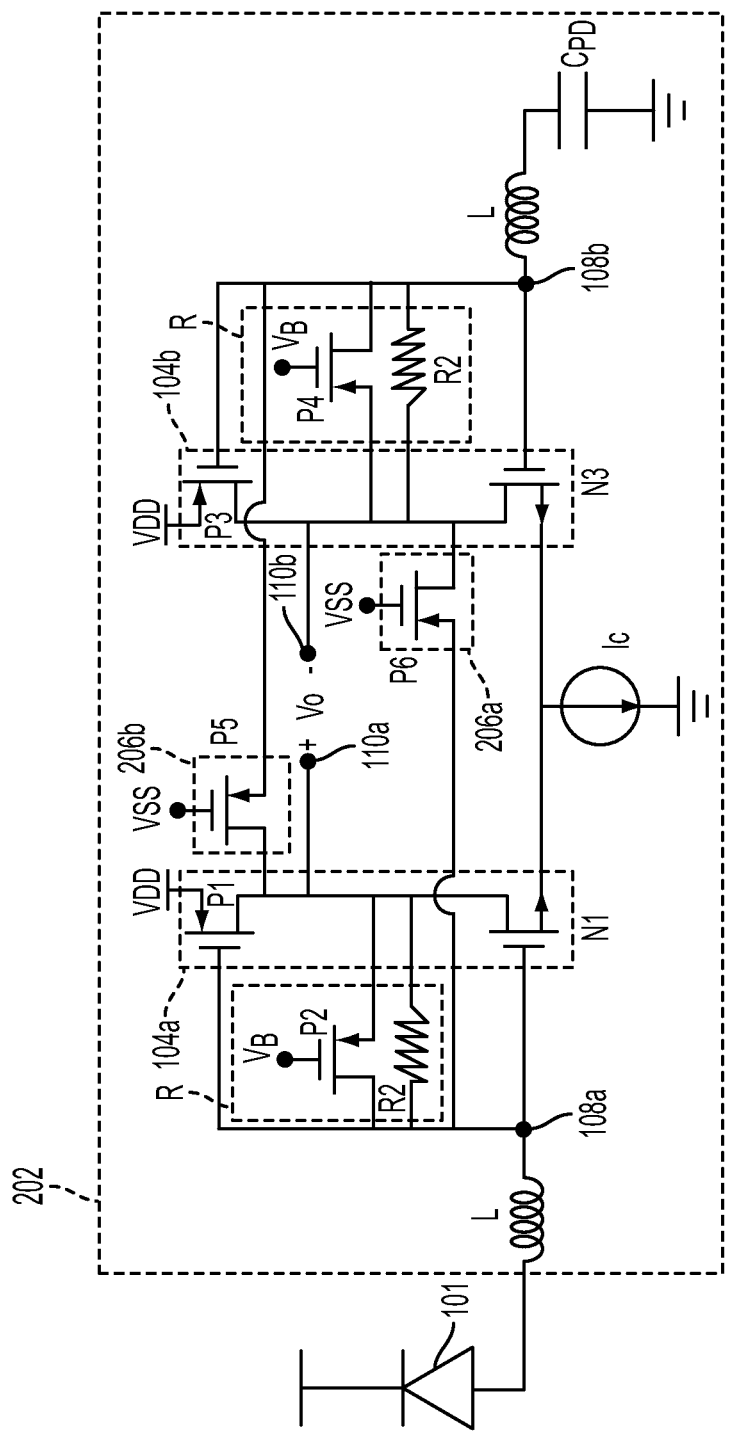
FIG. 4 is an exemplary circuit diagram of the TIA in FIG. 2 according to some embodiments.

FIG. 4 is an exemplary circuit diagram of the TIA in FIG. 2 according to some embodiments. The inverter 104a comprises a PMOS transistor P1 and an NMOS transistor N1. The inverter 104b comprises a PMOS transistor P3 and an NMOS transistor N3. The amplifier 206b comprises a PMOS transistor P5 and the amplifier 206a comprises a PMOS transistor P6. A PMOS transistor P2 is coupled in parallel with a resistor R2 and a PMOS transistor P4 is coupled in parallel with another resistor R2. By adjusting the bias voltage $V_B$ of the PMOS transistor P2 or P4, the effective resistance R can be adjusted. Also, and by adjusting the bias voltage $V_B$ of PMOS transistors P4, the effective combined resistance R of the resistor R1 and the PMOS transistor P2 or P4 can be changed.

Similar to the TIA 102 in FIG. 3, the TIA 202 in FIG. 4 provided the output voltage Vo with a clean eye pattern and a small jitter of less than 1 ps for a high speed input signal at 40 Gbps in one example, compared to a conventional TIA having a jitter of about 10 ps. Also, the efficiency in J/bit of the TIA 202 with 62.5 fj/bit, which is improved ten times compared to 625 fj/b of the conventional TIA. The frequency and speed of the TIA 202 is not limited to this example in other embodiments.

Figure 5:
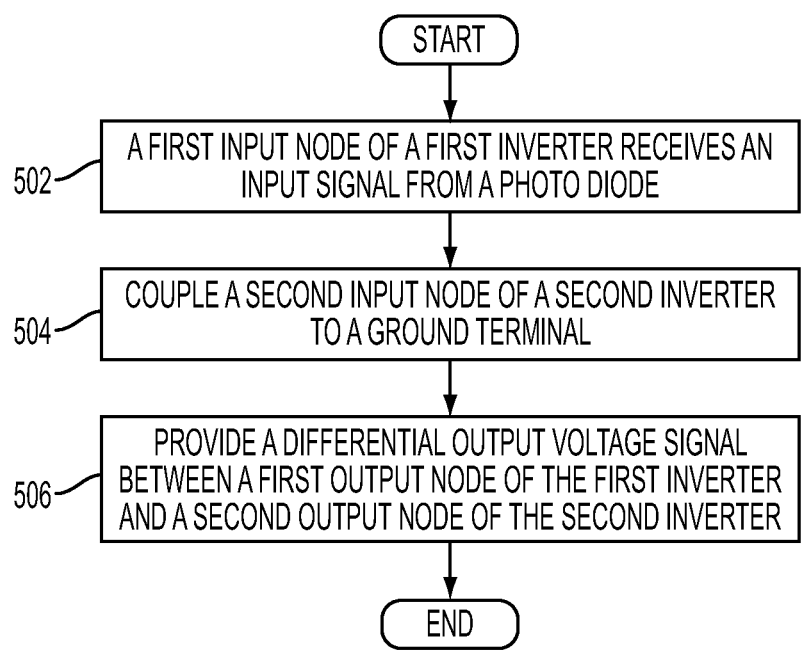
FIG. 5 is a flowchart of a method for operating the exemplary TIA in FIGS. 1-4 according to some embodiments.

FIG. 5 is a flowchart of a method for operating the exemplary TIA in FIGS. 1-4 according to some embodiments. At step 502, a first input node 108a of a first inverter 104a receives an input signal from a photo diode 101. At step 504, a second input node 108b of a second inverter 104b is coupled to a reference voltage terminal, such as to a ground terminal. At step 506, a differential output voltage signal Vo is provided between a first output node 110a of the first inverter 104a and a second output node 110b of the second inverter 104b.

In various embodiments, a first amplifier provides feedback to the first input node 108a and a second amplifier provides feedback to the second input node 108b. In some embodiments, the first amplifier 106b receiving a first input from the second input node 108b to provide inverting amplification to the first input node 108a. The second amplifier 106a receives a second input from the first input node 108a to provide inverting amplification to the second input node 108b. In some embodiments, the first amplifier 206a receives a first input from the second output node 110b to provide non-inverting amplification to the first input node 108a. The second amplifier 206b receives a second input from the first output node 110a to provide non-inverting amplification to the second input node 108b.

In various embodiments, a first resistor R is coupled between the first input node 108a and the first output node 110a. A second resistor R is coupled between the second input node 108b and the second output node 110b. A first inductor L is coupled to the first input node 108a for inductive peaking. A second inductor L is coupled to the second input node 108b for inductive peaking. A current source Ic coupled to both the first inverter 104a and the second inverter 104b for regulating electrical current. A capacitor $C_{PD}$ having an equivalent capacitance of a photo detector 101 is coupled between the second input node 108b and the reference voltage terminal (e.g., ground terminal).

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

In some embodiments, a transimpedance amplifier includes a first inverter having a first input node and a first output node. The first input node is configured to receive an input signal. A second inverter has a second input node and a second output node. The second input node connects to a reference voltage terminal. The first inverter and the second inverter are configured to provide a differential output voltage signal between the first output node and the second output node. A first amplifier and a second amplifier are configured to provide feedback to the first input node and the second input node, respectively.

In some embodiments, a transimpedance amplifier includes a first inverter having a first input node and a first output node. The first input node is configured to receive an input signal. A second inverter has a second input node and a second output node. The second input node connects to a reference voltage terminal. The first inverter and the second inverter are configured to provide a differential output voltage signal between the first output node and the second output node. An inductor connects to the first input node or the second input node.

In some embodiments, a transimpedance amplifier includes a first inverter having a first input node and a first output node. The first input node is configured to receive an input signal. A second inverter has a second input node and a second output node. The second input node connects to a reference voltage terminal. The first inverter and the second inverter are configured to provide a differential output voltage signal between the first output node and the second output node. A current source connects to the first inverter and to the second inverter.

What is claimed is:

1. A transimpedance amplifier (TIA), comprising:
a first inverter having a first input node and a first output node, wherein the first input node is configured to receive an input signal;
a second inverter having a second input node and a second output node, wherein the second input node connects to a reference voltage terminal,
wherein the first inverter and the second inverter are configured to provide a differential output voltage signal between the first output node and the second output node; and
a first amplifier and a second amplifier, wherein the first amplifier and the second amplifier are configured to provide feedback to the first input node and the second input node, respectively.

2. The TIA of claim 1, wherein the first amplifier is configured to receive a first input from the second input node and provide a first output to the first input node, the second amplifier is configured to receive a second input from the first input node and provide a second output to the second input node, and the first amplifier and the second amplifier are configured to provide inverting amplification.

3. The TIA of claim 2, wherein the first amplifier comprises a first NMOS transistor and the second amplifier comprises a second NMOS transistor.

4. The TIA of claim 1, wherein the first amplifier is configured to receive a first input from the second output node and provide a first output to the first input node, the second amplifier is configured to receive a second input from the first output node and provide a second output to the second input node, and the first amplifier and the second amplifier are configured to provide non-inverting amplification.

5. The TIA of claim 4, wherein the first amplifier comprises a first PMOS transistor and the second amplifier comprises a second PMOS transistor.

6. The TIA of claim 1, further comprising a first resistor that couples the first input node to the first output node and a second resistor that couples the second input node to the second output node.

7. The TIA of claim 6, further comprising a first PMOS transistor in parallel with the first resistor and a second PMOS transistor in parallel with the second resistor.

8. The TIA of claim 6, wherein the first resistor and the second resistor have the same resistance value.

9. The TIA of claim 1, wherein the reference voltage terminal is a ground terminal and the TIA further comprises:
a photo detector, wherein the photo detector is configured to provide the input signal; and
a capacitor, wherein the capacitor couples the second input node to the ground terminal and has an equivalent capacitance of the photo detector.

10. A transimpedance amplifier (TIA), comprising:
a first inverter having a first input node and a first output node, wherein the first input node is configured to receive an input signal;
a second inverter having a second input node and a second output node, wherein the second input node connects to a reference voltage terminal,
wherein the first inverter and the second inverter are configured to provide a differential output voltage signal between the first output node and the second output node; and
an inductor that connects to the first input node or the second input node.

11. The TIA of claim 10, further comprising:
a first, inverting amplifier configured to receive a first input from the second input node and provide a first output to the first input node; and
a second, inverting amplifier configured to receive a second input from the first input node and provide a second output to the second input node.

12. The TIA of claim 10, further comprising:
a first, non-inverting amplifier configured to receive a first input from the second output node and provide a first output to the first input node; and
a second, non-inverting amplifier configured to receive a second input from the first output node and provide a second output to the second input node.

13. The TIA of claim 10, further comprising another inductor that connects to the first input node or the second input node, wherein each of the first input node and the second input node connects to the same inductance value.

14. The TIA of claim 10, wherein the reference voltage terminal is a ground terminal and the TIA further comprises:
a photo detector, wherein the photo detector is configured to provide the input signal; and
a capacitor, wherein the capacitor couples the second input node to the ground terminal and has an equivalent capacitance of the photo detector.

15. A transimpedance amplifier (TIA), comprising:
a first inverter having a first input node and a first output node, wherein the first input node is configured to receive an input signal;
a second inverter having a second input node and a second output node, wherein the second input node connects to a reference voltage terminal,
wherein the first inverter and the second inverter are configured to provide a differential output voltage signal between the first output node and the second output node; and
a current source that connects to the first inverter and to the second inverter.

16. The TIA of claim 15, further comprising:
a first, inverting amplifier configured to receive a first input from the second input node and provide a first output to the first input node; and
a second, inverting amplifier configured to receive a second input from the first input node and provide a second output to the second input node.

17. The TIA of claim 16, wherein the current source further connects to the first inverting amplifier and to the second inverting amplifier.

18. The TIA of claim 15, further comprising:
a first, non-inverting amplifier configured to receive a first input from the second output node and provide a first output to the first input node; and
a second, non-inverting amplifier configured to receive a second input from the first output node and provide a second output to the second input node.

19. The TIA of claim 15, further comprising a first resistor that couples the first input node to the first output node and a second resistor that couples the second input node to the second output node.

20. The TIA of claim 15, wherein the reference voltage terminal is a ground terminal and the TIA further comprises:
a photo detector, wherein the photo detector is configured to provide the input signal; and
a capacitor, wherein the capacitor couples the second input node to the ground terminal and has an equivalent capacitance of the photo detector.

* * * * *